(12) United States Patent
Klein et al.

(10) Patent No.: US 12,235,321 B2
(45) Date of Patent: Feb. 25, 2025

(54) METHOD AND DEVICE FOR MONITORING A PLURALITY OF PARALLEL-CONNECTED SEMICONDUCTOR SWITCHES

(71) Applicant: Robert Bosch GmbH, Stuttgart (DE)

(72) Inventors: Andreas Klein, Stuttgart (DE); Christoph Kammer, Reutlingen (DE); Christoph Friederich, Reutlingen (DE); Marc Schober, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 133 days.

(21) Appl. No.: 18/304,831

(22) Filed: Apr. 21, 2023

(65) Prior Publication Data

US 2023/0349975 A1 Nov. 2, 2023

(30) Foreign Application Priority Data

Apr. 27, 2022 (DE) ...................... 10 2022 204 075.9

(51) Int. Cl.
*G01R 31/327* (2006.01)
*H03K 17/56* (2006.01)
(52) U.S. Cl.
CPC ......... *G01R 31/3277* (2013.01); *H03K 17/56* (2013.01)
(58) Field of Classification Search
USPC .................................................. 324/762.01
See application file for complete search history.

(56) References Cited

U.S. PATENT DOCUMENTS

2019/0386093 A1\* 12/2019 Pfirsch ................ H01L 29/1608

OTHER PUBLICATIONS

EIA/JESD51-1, "Integrated Circuits Thermal Measurement Method—Electrical Test Method (Single Semiconductor Device)," EIA/JEDEC Standard, Electronic Industries Association, Engineering Department, 1995, pp. 1-33. <https://www.jedec.org/system/files/docs/jesd51-1.pdf> Downloaded Apr. 21, 2023.

\* cited by examiner

*Primary Examiner* — Farhana A Hoque
(74) *Attorney, Agent, or Firm* — NORTON ROSE FULBRIGHT US LLP; Gerard A. Messina

(57) ABSTRACT

A method and a device for monitoring a plurality of parallel-connected semiconductor switches. The method includes subjecting the plurality of semiconductor switches to a heating pulse, in which a predefined load current flows for a predefined period of time in order to achieve a predefined temperature change of the semiconductor switches, a variable of a semiconductor switch to be monitored from the plurality of semiconductor switches being detected both before and after the application of the heating pulse, and a state of the semiconductor switch to be monitored and/or an electronics packaging, which corresponds to the semiconductor switch to be monitored, being ascertained on the basis of a deviation of the change of the at least one variable from a predefined reference value. The method enables a measurement of individual semiconductor switches to be monitored from the plurality of semiconductor switches.

10 Claims, 2 Drawing Sheets

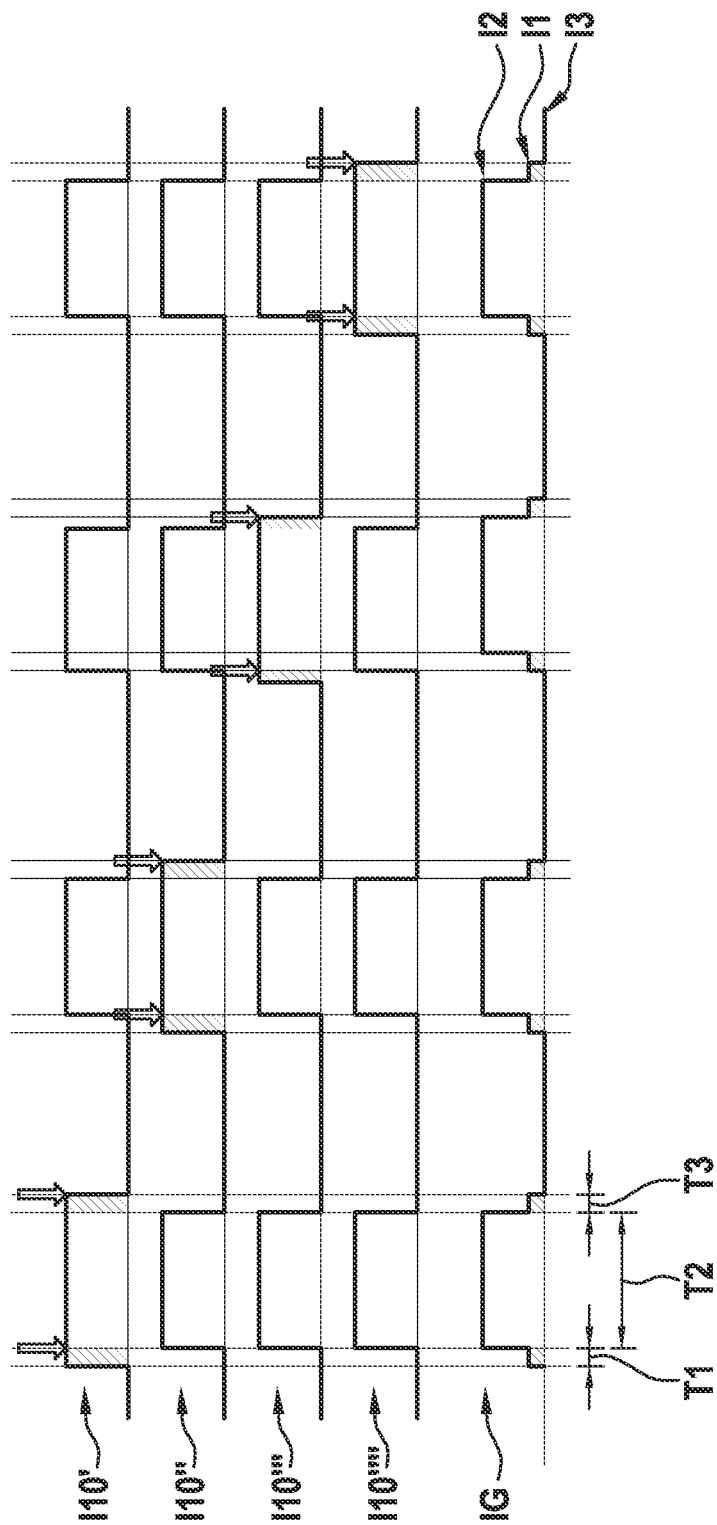

METHOD AND DEVICE FOR MONITORING A PLURALITY OF PARALLEL-CONNECTED SEMICONDUCTOR SWITCHES

CROSS REFERENCE

The present application claims the benefit under 35 U.S.C. § 119 of German Patent Application No. DE 10 2022 204 075.9 filed on Apr. 27, 2022, which is expressly incorporated herein by reference in its entirety.

FIELD

The present invention relates to a method and a device for monitoring a plurality of parallel-connected semiconductor switches, which are designed in particular as power semiconductor switches.

BACKGROUND INFORMATION

Testing methods for parallel-connected power semiconductors are available in the related art, which ascertain a change of parameters, in particular parameters of an electronics packaging corresponding to the power semiconductors on the basis of a sum temperature measurement. The methods defined in the testing guidelines AQG 324 or LV 324 are such testing methods, for example (see also the norm DIN EN 60747-15 and the measuring method according to JEDEC standard number 51-1).

Service life models for particular tested power semiconductors may be derived on the basis of such testing methods, which may be subject to a corresponding error due to the sum temperature measurement applied, however, since a drift or a failure of individual semiconductors in the parallel circuit is not detectable.

In particular, in power module structures including multiple power semiconductors of the same type, different temperature increase in the power semiconductors or in the particular corresponding electronics packaging during active operation is possible due to cross-heating, which is not individually detectable by the above-mentioned testing methods.

SUMMARY

According to a first aspect of the present invention, a method for monitoring a plurality of parallel-connected semiconductor switches is provided, the semiconductor switches being designed in particular as power semiconductor switches and preferably forming a topological switch. A number of the parallel-connected semiconductor switches is fundamentally arbitrarily selectable, it being possible, for example, to monitor two to eight or a number differing therefrom of parallel-connected semiconductor switches with the aid of the method according to the present invention. The number is advantageously oriented to a total power to be switched by the parallel-connected semiconductor switches.

Since the method provided here in particular also enables monitoring of effects of cross-heating between the individual semiconductor switches, a thermal coupling at least between a part of the plurality of semiconductor switches is advantageously to be presumed. Furthermore, the method provided here in particular also enables monitoring of an electronics packaging which corresponds to the particular semiconductor switches.

In a first step of the method according to an example embodiment of the present invention, a semiconductor switch presently to be monitored of the plurality of parallel-connected semiconductor switches is switched on, while the other semiconductor switches (i.e., the semiconductor switches not presently to be monitored) of the plurality of parallel-connected semiconductor switches are switched off or become switched off.

For this purpose, particular control inputs of the semiconductor switches are preferably each electrically connected to corresponding drivers (driver circuits), so that each semiconductor switch is switchable on and off independently of the particular other semiconductor switches. An activation for the particular switching on and off of the semiconductor switches takes place, for example, with the aid of an evaluation unit, which is configured to activate the particular drivers according to the method according to the present invention.

In a second step of the method according to an example embodiment of the present invention, the semiconductor switch presently to be monitored is subjected to a first predefined load current for the duration of a first predefined period of time. A request to provide the first load current is also generated, for example, by the evaluation unit according to the present invention and/or by a component differing therefrom. In the case of an advantageous use of power semiconductors, the first load current corresponds, for example, to a value of 50 A to 200 A, without thus restricting the usable level of the first load current. An establishment of a level of the first load current is preferably oriented to particular characteristic values of the semiconductor switches used and/or to current values which enable the most reliable possible temperature load ascertainment for the semiconductor switches.

In a third step of the method according to an example embodiment of the present invention, a first voltage drop across the parallel-connected load paths of the plurality of semiconductor switches within the first period of time is detected. Since in this period of time only the semiconductor switch to be monitored is switched on, the first voltage drop is essentially only influenced by the first semiconductor switch. The first period of time has, for example, a duration of a few milliseconds, without thus being restricted to such a duration. Furthermore, a point in time of the detection within the first period of time is not established in principle, as long as reliable measurement results are ensured after the switching on of the semiconductor switch to be monitored (for example after reaching a steady state).

In a fourth step of the method according to an example embodiment of the present invention, all semiconductor switches of the plurality of parallel-connected semiconductor switches are switched on after termination of the first period of time (preferably immediately in response to the termination of the first period of time).

In a fifth step of the method according to an example embodiment of the present invention, the plurality of parallel-connected semiconductor switches are subjected to a predefined second load current for the duration of a predefined second period of time, the second load current being higher than the first load current and an establishment of a level of the second load current and an establishment of a duration of the second period of time ensuring a predefined temperature rise to be achieved (for example in a range of 10 K to 160 K, preferably between 30 K and 140 K, and in particular preferably between 60 K and 110 K, or values differing therefrom) during the second period of time. A duration of the second period of time is, for example, 3 seconds to 15 seconds, without thus being restricted to such a duration. The plurality of semiconductor switches is jointly heated by the second load current, which is also referred to hereinafter as a heating current, so that possibly present cross-heating may also have an effect on the individual semiconductor switches.

In a sixth step of the method according to an example embodiment of the present invention, all semiconductor switches presently not to be monitored of the plurality of parallel-connected semiconductor switches are switched off after termination of the second period of time.

In a seventh step of the method according to an example embodiment of the present invention, the semiconductor switch to be monitored is again subjected to the first load current for the duration of a third predefined period of time, so that due to the renewed use of the first load current, comparable current conditions are produced to the measurement of the voltage drop within the first period of time.

In an eighth step of the method according to an example embodiment of the present invention, a second voltage drop across the parallel-connected load paths of the plurality of semiconductor switches is detected within the third period of time and preferably immediately before termination of the third period of time, the third period of time advantageously being selected in such a way that the second voltage drop is detected when the semiconductor switches presently not to be monitored have significantly cooled, while the semiconductor switch presently to be monitored, due to cross-heating, only has a minor temperature drop in relation to a temperature at the end of the second period of time. This minor temperature drop is to be within the scope of a required and/or possible measurement accuracy when carrying out the method according to the present invention.

In a ninth step of the method according to an example embodiment of the present invention, a change of at least one variable (e.g., a temperature and/or a temperature coefficient and/or an internal resistance) of the semiconductor switch to be monitored between the detection of the first voltage drop and the detection of the second voltage drop is ascertained, the change being ascertained on the basis of the first load current, the first voltage drop, the second load current, and the second voltage drop. For example, a change of an internal resistance of the semiconductor switch to be monitored may be ascertained from the respective quotients of the first voltage drop and the first load current and of the second voltage drop and the second load current. Accordingly, a temperature change between the two detection points in time may be derived on the basis of the change of the internal resistance.

In a tenth step of the method according to an example embodiment of the present invention, a state of the semiconductor switch to be monitored and/or an electronics packaging which corresponds to the semiconductor switch to be monitored is ascertained on the basis of a deviation of the change of the at least one variable from a predefined reference value.

In an exemplary case, in which the deviation of the change from the reference value exceeds a predefined maximum permissible deviation, an error of the semiconductor switch and/or the electronics packaging is present with high probability. The latter occurs, for example, if a connecting material for thermally contacting the semiconductor switch to be monitored with a heat dissipation element has a degradation, so that the resulting temperature change between the two detection points in time is higher than would be expected in an error-free state of the electronics packaging.

The above method is advantageously executed alternately and repeatedly for each of the semiconductor switches of the plurality of parallel-connected semiconductor switches in order to be able to progressively monitor unfavorable temperature changes of the particular semiconductor switches, which may indicate an error state.

In general, it is to be noted that the sequence of the method steps used in the above description represents a preferred execution sequence of the method, but it is not necessary to observe this completely. In particular, it is possible that the first load current and/or the second load current are set and/or provided simultaneously or immediately before or immediately after the particular switching point in time of the semiconductor switches. Moreover, it is possible that the semiconductor switch presently to be monitored is changed during the execution of the method steps in order to compare measurements of different semiconductor switches to one another and/or to temporarily store measurement results of particular semiconductor switches and compare them to measurement results of the same semiconductor switch in each case from different passes of the method according to the present invention.

Preferred refinements of the present invention are disclosed herein.

In one advantageous example embodiment of the present invention, the reference value is a value which was ascertained on the basis of a preceding monitoring of the semiconductor switch presently to be monitored (for example from an immediately preceding monitoring cycle or an earlier monitoring cycle) and/or on the basis of a preceding monitoring of at least one semiconductor switch differing from the semiconductor switch presently to be monitored and/or on the basis of a datasheet of the semiconductor switch to be monitored and/or on the basis of a measurement of the semiconductor switch to be monitored under predefined temperature conditions and/or on the basis of a sum temperature measurement of all semiconductor switches of the plurality of parallel-connected semiconductor switches. It is to be noted that reference values ascertained from preceding monitorings are also ascertainable on the basis of a plurality of individual values in that, for example, individual values (resulting values) of successive monitorings of a particular semiconductor switch are combined to form a reference value. The combination takes place, for example, by averaging over the particular individual values or by a calculation rule differing therefrom.

The semiconductor switches of the plurality of parallel-connected semiconductor switches are advantageously each MOSFETs and/or IGBTs and/or JFETs and/or HEMTs and as such are designed, for example, based on Si, based on SiC, or based on GaN. Alternatively or additionally, the particular semiconductor switches are advantageously integrated into a semiconductor module and/or arranged in an inverter, in particular in an inverter for a vehicle.

The method is particularly advantageously carried out in accordance with a predefined sequence repeatedly for all semiconductor switches of the plurality of parallel-connected semiconductor switches. The repeated execution of the method, for example, takes place until one or multiple predefined abort conditions are met. The temperature rise, which is ascertained between the detection of the first voltage drop and the detection of the second voltage drop, exceeding a maximum permissible temperature rise comes into consideration as an abort condition, for example. Alternatively or additionally, it is possible to adapt a sequence for monitoring the particular semiconductor switches as a function of predefined boundary conditions.

In one particularly advantageous example embodiment of the present invention, the method according to the present invention is integrated into an existing testing method for semiconductor switches, in which sum temperature measurements take place over all parallel-connected semiconductor switches between particular application periods of time of the semiconductor switches using a heating pulse, the sum temperature measurement taking place while the semiconductor switches are subjected to a third predefined load current (for example 100 mA or differing therefrom), which is less than the first load current and/or the existing testing method is carried out unchanged in parallel and/or the heating pulses of the existing testing method corresponding to subjecting the semiconductor switches to the second load current in the second period of time. For example, the testing guidelines AQG 324 or LV 324 are such existing testing methods and are usable in combination with the method according to the present invention.

The load currents used, i.e., the first load current, the second load current, and possibly the above-mentioned third load current, may be generated with the aid of particular activations of a variable current source and/or with the aid of switchable separate current sources, each of which provides one of the load currents. Alternatively or additionally, the second load current essentially corresponds to a value which is obtained by multiplication of the first load current by the number of parallel-connected semiconductor switches. In this way, a load current flowing across the semiconductor switch presently to be monitored is identical or essentially identical in each case in the first period of time, in the second period of time, and in the third period of time.

Advantageously, each semiconductor switch of the plurality of parallel-connected semiconductor switches is thermally connected to a cooling element (heat sink) to dissipate heat generated by the semiconductor switches. The cooling element is, for example, a cooling element which is provided separately for each semiconductor switch. Alternatively, it is also possible that one cooling element is used for a subset of the semiconductor switches or is jointly used for all semiconductor switches.

In another advantageous example embodiment of the present invention, the method according to the present invention is used on a test stand for semiconductor switches (for example in a development phase of the semiconductor switches or of modules which contain these semiconductor switches) and/or in a productive use (for example in a vehicle, for example for a diagnostic function, etc.) of the semiconductor switches.

A service life model for the particular semiconductor switches and/or for a higher-order component including the semiconductor switches (for example a semiconductor module) is preferably ascertained and/or adapted on the basis of the ascertained state of the particular semiconductor switches. Alternatively or additionally, a load for the particular semiconductor switch is adapted on the basis of the ascertained state of the particular semiconductor switch. The latter may advantageously be used in particular in a productive use of the method according to the present invention, in that those semiconductor switches, whose electronics packaging has a reduced heat dissipation capability due to an error, are less loaded by a suitable activation of these semiconductor switches. A further usability of a component using the method according to the present invention (for example an inverter of a vehicle) may also be ensured for a certain period of time if degradation of one or multiple semiconductor switches is already present.

According to a second aspect of the present invention, a device is provided for monitoring a plurality of parallel-connected semiconductor switches. The device includes at least one current source, a voltage sensor, and an evaluation unit. The evaluation unit is designed, for example, as an ASIC, FPGA, processor, digital signal processor, microcontroller, or the like and is configured to switch on a semiconductor switch presently to be monitored of the plurality of parallel-connected semiconductor switches, while the other semiconductor switches of the plurality of parallel-connected semiconductor switches are switched off or become switched off. Particular gate drivers corresponding to the semiconductor switches are integrated into the evaluation unit, for example, for an activation of the particular semiconductor switches. Alternatively, it is also possible that the particular gate drivers are formed separately from the evaluation unit and are electrically connected to the evaluation unit for an activation by the evaluation unit. The evaluation unit is furthermore configured to subject the semiconductor switch presently to be monitored to a first predefined load current provided by the at least one current source for the duration of a first predefined period of time, to detect a first voltage drop across the parallel-connected load paths of the plurality of semiconductor switches within the first period of time with the aid of the voltage sensor, to switch on all semiconductor switches of the plurality of parallel-connected semiconductor switches after termination of the first period of time, to subject the plurality of parallel-connected semiconductor switches to a predefined second load current provided by the at least one current source for the duration of a predefined second period of time, the second load current being higher than the first load current and an establishment of a level of the second load current and an establishment of a duration of the second period of time ensuring a predefined temperature rise to be achieved during the second period of time. The evaluation unit is in addition configured to switch off all semiconductor switches not presently to be monitored of the plurality of parallel-connected semiconductor switches after termination of the second period of time, to subject the semiconductor switch to be monitored to the first predefined load current for the duration of a third predefined period of time, to detect a second voltage drop across the parallel-connected load paths of the plurality of semiconductor switches within the third period of time, to ascertain a change of at least one variable of the semiconductor switch to be monitored between the detection of the first voltage drop and the detection of the second voltage drop, the change being ascertained on the basis of the first load current, the first voltage drop, the second load current, and the second voltage drop. Finally, the evaluation unit is configured to ascertain a state of the semiconductor switch to be monitored and/or an electronics packaging which corresponds to the semiconductor switch to be monitored on the basis of a deviation of the change of the at least one variable from a predefined reference value.

BRIEF DESCRIPTION OF THE DRAWINGS

Exemplary embodiments of the present invention are described in detail hereinafter with reference to the figures.

FIG. 2 shows exemplary current profiles in a plurality of parallel-connected semiconductor switches.

DETAILED DESCRIPTION OF EXAMPLE EMBODIMENTS

Figure 1:
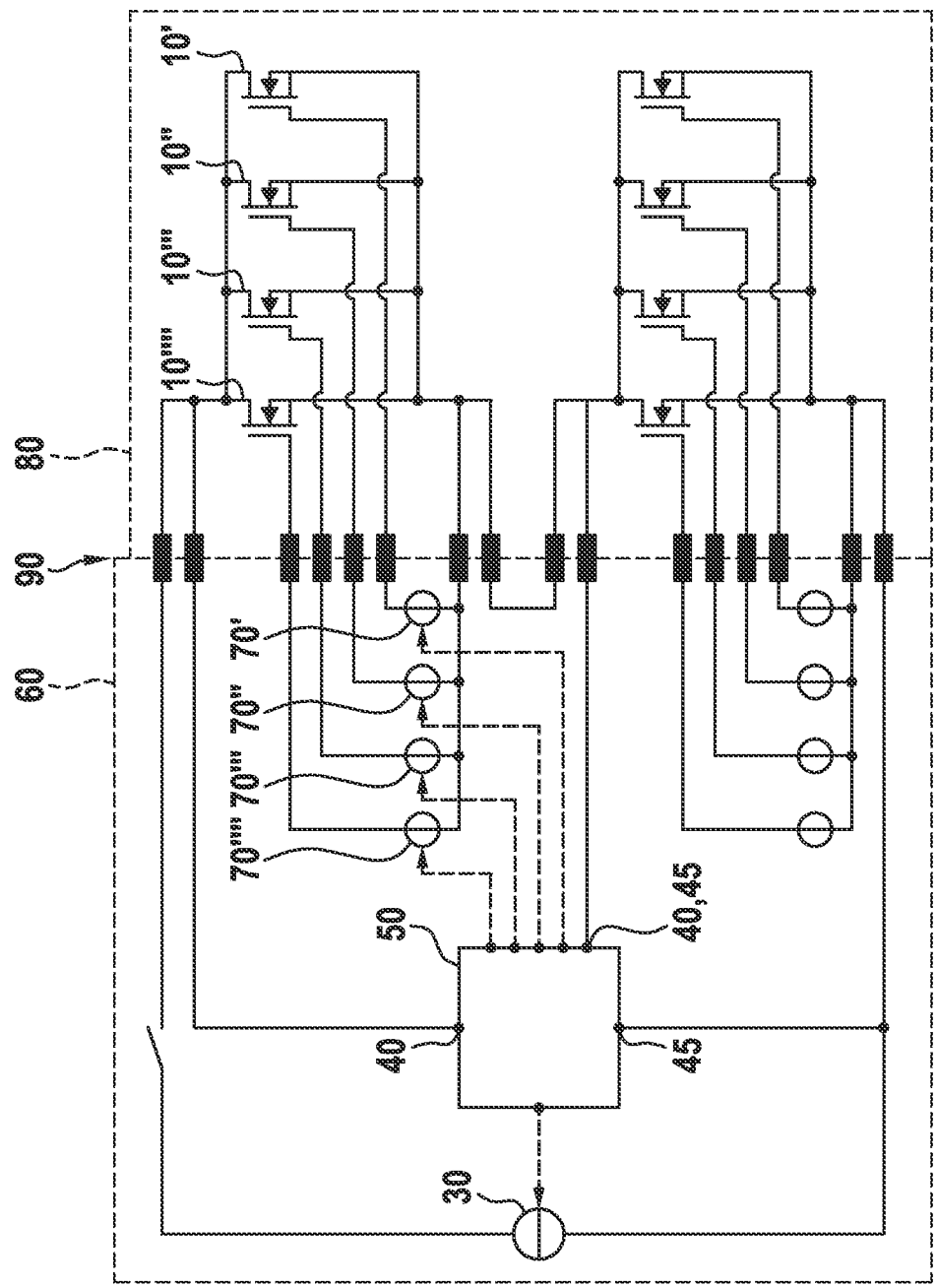
FIG. 1 shows an exemplary embodiment of a circuit diagram of a monitoring device according to the present invention in conjunction with a power semiconductor module to be monitored.

FIG. 1 shows an exemplary embodiment of a circuit diagram of a monitoring device 60 according to the present invention in conjunction with a power semiconductor module 80 to be monitored, power semiconductor module 80 including four parallel-connected high-side power semiconductor switches 10', 10", 10''', 10'''' (also designated hereinafter in short by reference numeral "10") each having corresponding gate drivers 70', 70", 70''', 70'''' (also designated hereinafter in short by reference numeral "70"), gate drivers 70 being electrically connected to an evaluation unit 50, designed here as a microcontroller, of monitoring device 60. Power semiconductor switches 10 are each designed here as SiC-MOSFETs and power semiconductor module 80 is arranged by way of example here in an inverter, which is provided for a drivetrain of a vehicle.

In addition, power semiconductor module 80 to be monitored includes four parallel-connected low-side power semiconductor switches, which are not provided with reference numerals here for reasons of clearer representation. Gate drivers corresponding to the low-side power semiconductor switches are also not provided with reference numerals, moreover, their electrical connection, which is carried out similarly to the connection of the high side, is also not shown.

Evaluation unit 50 is additionally electrically connected to a variable current source 30, so that evaluation unit 50 is configured to set different output currents for variable current source 30 with the aid of an activation of variable current source 30.

Monitoring device 60 is electrically connected to power semiconductor module 80 to be monitored via an interface 90, which is formed by electrical contacts of monitoring device 60 and power semiconductor module 80.

With the aid of a first voltage sensor 40, evaluation unit 50 is configured to detect a voltage across the load paths of high-side power semiconductor switches 10, while it is configured with the aid of a second voltage sensor 45 to detect a voltage across the load paths of the low-side power semiconductor switches.

Evaluation unit 50 is configured on the basis of the preceding configuration and on the basis of a computer program executable by evaluation unit 50 to carry out the above-described method according to the present invention.

FIG. 2 shows exemplary current profiles I10', I10", I10''', I10'''' in a plurality of parallel-connected semiconductor switches 10', 10", 10''', 10'''' and a total current profile IG via all parallel-connected semiconductor switches 10', 10", 10''', 10''''. Current profiles I10', I10", I10''', I10'''' correspond, for example, to high-side power semiconductor switches 10 shown in FIG. 1.

I10' represents here the current profile through semiconductor switch 10' presently to be monitored according to the method according to the present invention. First period of time T1 is apparent from FIG. 2, in which only semiconductor switch 10' presently to be monitored from the plurality of semiconductor switches 10 is switched on and is subjected to a first load current I1. At the end of first period of time T1, a first voltage drop across the parallel-connected load paths of the plurality of semiconductor switches 10 is detected. The point in time of the detection is identified by the left of the two arrows in current profile I10'.

At the beginning of a second period of time T2 immediately following first period of time T1, all semiconductor switches 10', 10", 10''', 10'''' are now switched on and jointly subjected to a second load current I2, which is essentially four times as high as first load current I1.

At the beginning of a third period of time T3 immediately following second period of time T2, all semiconductor switches 10", 10''', 10'''' not presently to be monitored are now switched off, while semiconductor switch 10' to be monitored is again subjected to first load current I1. At the end of third period of time T3, a second voltage drop is detected, the detection point in time being identified by the right of the two arrows in current profile I10'.

On the basis of the detected voltage drops and particular load currents I1, I2, according to the method according to the present invention, a deviation from an expected temperature behavior of semiconductor switch 10' to be monitored is ascertained.

In a subsequent pass of the method according to the present invention, semiconductor switch 10" is defined as the semiconductor switch presently to be monitored and in further subsequent passes accordingly semiconductor switches 10''', 10''''.

This sequence for the monitoring of particular semiconductor switches 10', 10", 10''', 10'''' is subsequently repeated in its entirety until a predefined abort condition is met.

Total current profile IG shown in FIG. 2 is made up of the individual currents through particular semiconductor switches 10', 10", 10''', 10''''. It is to be noted that a vertical scaling in the representation of total current profile IG is not identical for reasons of simplified representation to the vertical scaling of the representation of individual current profiles I10', I10", I10''', I10''''.

A testing method (for example according to AQ324) from the related art is advantageously carried out in parallel to the method according to the present invention. For this purpose, semiconductor switches 10', 10", 10''', 10'''' are subjected in periods of time between particular third periods of time T3 and periods of time T1 immediately following them to a third load current I3, third load current I3 approximately corresponding to 100 mA here and third load current I3 being a current which flows as the forward current of particular body diodes of semiconductor switches 10. On the basis of successive joint voltage measurements over the particular body diodes, a mean temperature rise for all semiconductor switches 10', 10", 10''', 10'''' may thus be derived jointly.

What is claimed is:

1. A method for monitoring a plurality of parallel-connected semiconductor switches, comprising:
    switching on a semiconductor switch of the plurality of parallel-connected semiconductor switches presently to be monitored of the plurality of parallel-connected semiconductor switches, while the other semiconductor switches of the plurality of parallel-connected semiconductor switches are switched off or become switched off;
    subjecting the semiconductor switch to be monitored to a first predefined load current for a duration of a first predefined period of time;
    detecting a first voltage drop across parallel-connected load paths of the plurality of semiconductor switches within the first period of time;
    switching on all semiconductor switches of the plurality of parallel-connected semiconductor switches after termination of the first period of time;

subjecting the plurality of parallel-connected semiconductor switches to a predefined second load current for a duration of a predefined second period of time,
the second load current being higher than the first load current, and
an establishment of a level of the second load current and an establishment of the duration of the second period of time ensuring a predefined temperature rise to be achieved during the second period of time;
switching off all semiconductor switches not presently to be monitored of the plurality of parallel-connected semiconductor switches after termination of the second period of time;
subjecting the semiconductor switch to be monitored to the first predefined load current for a duration of a third predefined period of time;
detecting a second voltage drop across the parallel-connected load paths of the plurality of semiconductor switches within the third period of time;
ascertaining a change of at least one variable of the semiconductor switch to be monitored between the detection of the first voltage drop and the detection of the second voltage drop, the change being ascertained based on the first load current, the first voltage drop, the second load current, and the second voltage drop; and
ascertaining a state of the semiconductor switch to be monitored and/or an electronics packaging which corresponds to the semiconductor switch to be monitored, based on a deviation of the change of the at least one variable from a predefined reference value.

2. The method as recited in claim 1, wherein the reference value is a value which was ascertained based on:
a preceding monitoring of the semiconductor switch presently to be monitored, and/or
a preceding monitoring of at least one semiconductor switch differing from the semiconductor switch presently to be monitored, and/or
a datasheet of the semiconductor switch presently to be monitored, and/or
a measurement of the semiconductor switch to be monitored under predefined temperature conditions, and/or
a sum temperature measurement of all semiconductor switches of the plurality of parallel-connected semiconductor switches.

3. The method as recited in claim 1, wherein the semiconductor switches of the plurality of parallel-connected semiconductor switches are
MOSFETs, and/or
IGBTs, and/or
JFETs, and/or
HEMTs, and/or
integrated into a semiconductor module, and/or
arranged in an inverter for a vehicle.

4. The method as recited in claim 1, wherein:
the method is carried out in accordance with a predefined sequence repeatedly for all semiconductor switches of the plurality of parallel-connected semiconductor switches, and/or
a sequence for monitoring the semiconductor switches is adapted as a function of predefined boundary conditions.

5. The method as recited in claim 1, wherein the method is integrated into an existing testing method for semiconductor switches in which particular sum temperature measurements take place over all parallel-connected semiconductors between particular periods of time of subjecting the semiconductor switches to a heating pulse,
the sum temperature measurements taking place while the semiconductor switches are subjected to a third predefined load current, which is less than the first load current, and/or
the existing testing method being executed unchanged in parallel, and/or
the heating pulses of the existing testing method corresponding to the subjecting of the semiconductor switches to the second load current in the second period of time.

6. The method as recited in claim 1, wherein
the first and second load currents used are generated using:
particular activations of a variable current source, and/or
using switchable separate current sources; and/or
the second load current corresponds to a value obtained by a multiplication of the first load current by a number of parallel-connected semiconductor switches.

7. The method as recited in claim 1, wherein each semiconductor switch is thermally connected to a cooling element to dissipate generated heat.

8. The method as recited in claim 1, wherein the method is used on a test stand for semiconductor switches and/or in a production use of the semiconductor switches.

9. The method as recited in claim 1, wherein based on the ascertained state of the semiconductor switches:
a service life model for each semiconductor switch and/or for a higher-order component including the semiconductor switch is ascertained and/or adapted, and/or
a load for the semiconductor switch is adapted.

10. A device configured to monitor a plurality of parallel-connected semiconductor switches, comprising:
at least one current source;
a voltage sensor; and
an evaluation unit, wherein the evaluation unit is configured to:
switch on a semiconductor switch presently to be monitored of the plurality of parallel-connected semiconductor switches, while the other semiconductor switches of the plurality of parallel-connected semiconductor switches are switched off or become switched off;
subject the semiconductor switch to be monitored to a first predefined load current provided by the at least one current source for a duration of a first predefined period of time;
detect a first voltage drop across the parallel-connected load paths of the plurality of semiconductor switches within the first period of time using the voltage sensor;
switch on all semiconductor switches of the plurality of parallel-connected semiconductor switches after termination of the first period of time;
subject the plurality of parallel-connected semiconductor switches to a predefined second load current provided by the at least one current source for a duration of a predefined second period of time,
the second load current being higher than the first load current, and
an establishment of a level of the second load current and an establishment of a duration of the second period of time ensuring a predefined temperature rise to be achieved during the second period of time;

switch off all semiconductor switches not presently to be monitored of the plurality of parallel-connected semiconductor switches after termination of the second period of time;

subject the semiconductor switch to be monitored to the first predefined load current for the duration of a third predefined period of time;

detect a second voltage drop across the parallel-connected load paths of the plurality of semiconductor switches within the third period of time;

ascertain a change of at least one variable of the semiconductor switch to be monitored between the detection of the first voltage drop and the detection of the second voltage drop, the change being ascertained based on the first load current, the first voltage drop, the second load current, and the second voltage drop; and ascertain a state of the semiconductor switch to be monitored and/or an electronics packaging, which corresponds to the semiconductor switch to be monitored, based on a deviation of the change of the at least one variable from a predefined reference value.

\* \* \* \* \*